(12) United States Patent
Tanaya

(10) Patent No.: US 7,675,224 B2
(45) Date of Patent: Mar. 9, 2010

(54) PIEZOELECTRIC VIBRATING REED AND PIEZOELECTRIC DEVICE

(75) Inventor: Hideo Tanaya, Suwa (JP)

(73) Assignee: Seiko Epson Corporation (JP)

( * ) Notice: Subject to any disclaimer, the term of this patent is extended or adjusted under 35 U.S.C. 154(b) by 211 days.

(21) Appl. No.: 11/380,273

(22) Filed: Apr. 26, 2006

(65) Prior Publication Data

US 2007/0024163 A1    Feb. 1, 2007

(30) Foreign Application Priority Data

Apr. 27, 2005    (JP) .............................. 2005-129907

(51) Int. Cl.
*H01L 41/04*    (2006.01)
*H01L 41/053*    (2006.01)

(52) U.S. Cl. ...................... 310/370; 310/320; 310/321; 310/348

(58) Field of Classification Search ................. 310/320, 310/321, 370, 345, 348, 351
See application file for complete search history.

(56) References Cited

U.S. PATENT DOCUMENTS

| | | | |
|---|---|---|---|
| 6,262,520 B1 * | 7/2001 | Knowles | 310/370 |
| 7,342,352 B2 | 3/2008 | Kawashima | |
| 7,365,478 B2 | 4/2008 | Kawashima | |
| 2002/0125794 A1 * | 9/2002 | Tanaya et al. | 310/323.06 |
| 2004/0263027 A1 | 12/2004 | Kawashima | |
| 2005/0017604 A1 * | 1/2005 | Yamada | 310/370 |
| 2005/0062368 A1 | 3/2005 | Hirasawa et al. | |
| 2006/0049722 A1 * | 3/2006 | Dalla Piazza et al. | 310/348 |
| 2009/0102327 A1 | 4/2009 | Kawashima | |

FOREIGN PATENT DOCUMENTS

| | | |
|---|---|---|
| EP | 1478090 | 11/2004 |
| JP | 53-060594 | 5/1978 |
| JP | 54-037488 | 3/1979 |
| JP | 56-034216 | 4/1981 |
| JP | 57185717 | 11/1982 |
| JP | 2002-261575 | 9/2002 |
| JP | 2004-200914 | 7/2004 |
| JP | 2005-039767 | 2/2005 |

OTHER PUBLICATIONS

Communication from the European Patent Office regarding corresponding application.

* cited by examiner

*Primary Examiner*—Walter Benson
*Assistant Examiner*—Derek J Rosenau
(74) *Attorney, Agent, or Firm*—Harness, Dickey & Pierce, P.L.C.

(57) ABSTRACT

There is provided a piezoelectric vibrating reed, including: a base formed of a piezoelectric material and having a predetermined length; a plurality of vibrating arms extended from one side of the base; a support arm extended in a width direction from the other side spaced apart from the one side of the base by a predetermined interval and extended outside the vibrating arms in the same direction as the vibrating arms; and a cut portion formed of the piezoelectric material reduced in its width direction at a location closer to the vibrating arms than a connection portion where the support arms are connected to the base as one body, wherein a through-hole is also disposed at a location closer to the vibrating arms than the connection portion where the support arms are connected to the base as one body.

22 Claims, 8 Drawing Sheets

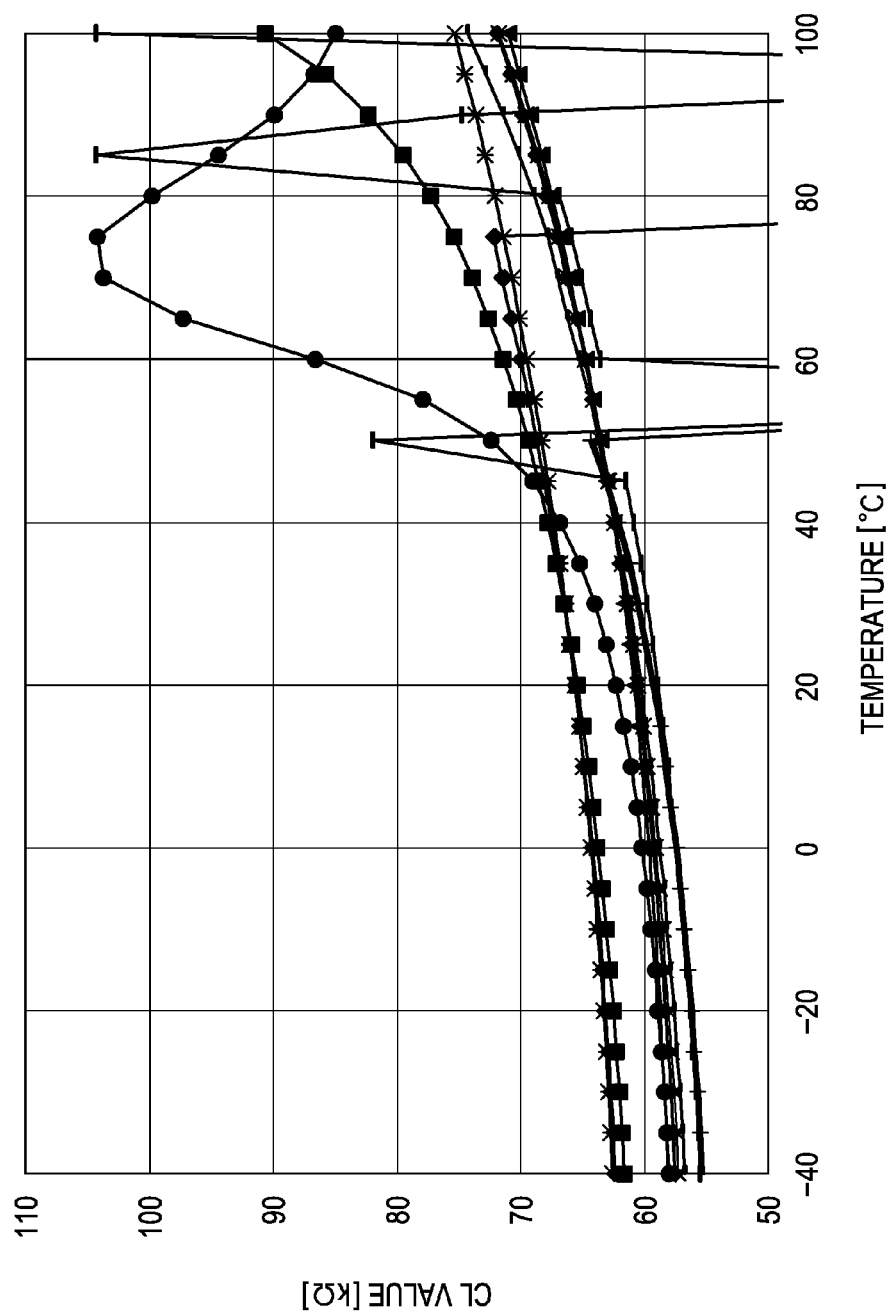

PIEZOELECTRIC VIBRATING REED AND PIEZOELECTRIC DEVICE

BACKGROUND

1. Field of the Invention

The present invention relates to an improvement of a piezoelectric vibrating reed, and a piezoelectric device which has received the piezoelectric vibrating reed within a package or a case.

2. Description of the Related Art

A piezoelectric device such as a piezoelectric vibrator or a piezoelectric oscillator is widely employed in a small-sized information apparatus such as an integrated card (IC) card, a hard disk drive (HDD), a mobile computer, a communication apparatus such as a cellular phone, a car phone, a paging system, or a piezoelectric gyro sensor.

FIG. 9 is a schematic plan view of an example of the piezoelectric vibrating reed which has been employed for the piezoelectric device in the related art.

Referring to FIG. 9, an outer shape of the piezoelectric vibrating reed 1 is formed by etching a piezoelectric material such as quartz, and the piezoelectric vibrating reed 1 has a rectangular base 2 to be mounted on a package (not shown), and a pair of vibrating arms 3 and 4 which extend upward from the base 2, and long grooves 3a and 4a are formed in both surfaces of the vibrating reeds, thereby forming a required driver electrode (see JPA 2002-261575).

In such a piezoelectric vibrating reed 1, when the driver electrode is made to apply a drive voltage, leading ends of the vibrating arms 3 and 4 wind and vibrate by being close to and spaced apart from each other, so that signals having predetermined frequencies are taken out.

However, the piezoelectric vibrating reed 1 has extraction electrodes at a location denoted as reference numerals 5 and 6 of the base 2, which is applied with adhesives 7 and 8 to be fixed to a body such as a package.

After the fixation by means of the adhesives, cut portions 9 and 9 are formed in the base 2 so as to prevent a residual stress due to a difference between coefficients of linear expansion between the material for forming constituting the piezoelectric vibrating reed and the material for forming the package or the like from disturbing the winding vibration of the vibrating arms.

As such, a progress in miniaturization has been made in the piezoelectric vibrating reed 1 so that arm widths W1 of the vibrating arms 3 and 4 are about 100 μm, a distance therebetween is about 100 μm, and a width BW1 of the base 2 is about 500 μm. These values are made to decrease, a length BL1 of the base correspondingly decreases, so that the piezoelectric vibrating reed 1 is small-sized.

However, the piezoelectric vibrating reed 1 which has been small-sized has problems in terms of temperature characteristics as follows.

FIG. 10 is a graph illustrating the temperature characteristic of the piezoelectric vibrating reed 1, which particularly illustrates temperature-Crystal Impedance (CI) value characteristics.

As shown in FIG. 10, the temperature-CI value characters are severely unstable in the piezoelectric vibrating reed 1 of the related art.

It is expected that the degradation of the temperature-CI value characteristics is resulted from the change in stress of the location where the base 2 is bonded with the adhesives 7 and 9 due to the change in temperature, and it is also expected that the same effect occurs even when the stress changes in the location where the base 2 is bonded with the adhesives 7 and 9 when a drop impact occurs on the piezoelectric vibrating reed 1.

In particular, when the cut portions 9 and 9 are more cut toward their central directions in order to effectively suppress the CI value by reducing the leakage into the base 2 due to the winding vibration of the vibrating arms, the rigidity of the base 2 is significantly reduced to cause the vibration state to be unstable.

SUMMARY

An advantage of the invention is to provide a piezoelectric vibrating reed and a piezoelectric device having a good temperature characteristic in fixed miniaturization by preventing a vibration leakage to avoid an adverse effect of a fixed portion and enhance an impact resistance.

According to an first aspect of the invention, there is provided a piezoelectric vibrating reed, which includes: a base formed of a piezoelectric material and having a predetermined length; a plurality of vibrating arms extended from one side of the base; a support arm extended in a width direction from the other side spaced apart from the one side of the base by a predetermined interval and extended outside the vibrating arms in the same direction as the vibrating arms; and a cut portion formed of the piezoelectric material reduced in its width direction at a location closer to the vibrating arms than a connection portion where the support arms are connected to the base as one body. In this case, a through-hole is also disposed at a location closer to the vibrating arms than the connection portion where the support arms are connected to the base as one body.

According to the configuration of the first aspect, the vibrating arm which winds and vibrates extends from an end of the base, and the support arm extends from the other end of the base having the predetermined length.

Accordingly, the change in stress occurring on in the bonded location due to the change in ambient temperature or dropped impact hardly affects the vibrating arms 35 and 36 by having the wound distance from the bonded location of the support arms 61 and 62 to the other end 53 of the base 51 spaced apart from the distance corresponding to the length exceeding the distance BL2 of the base 51, so that the temperature characteristic becomes particularly good.

In contrast, the vibration leakage from the vibrating arms which wind and vibrate is hardly affected by having the distance to the support arms and which has spaced the base by a predetermined length of the base exceeding the distance BL2. That is, when the length of the base is extremely short, a strong component of the winding vibration is delivered to the whole support arms to make the control difficult, however, according to the present embodiment, such a problem is sufficiently avoided.

In addition to such operations, the support arms extend in a width direction from the other end of the base as shown in the Figure and extend in the same direction as the vibrating arms outside the vibrating arms, so that the total size can be made to be compact.

In addition, the cut portions formed of the piezoelectric material that is reduced in the width direction can act to suppress the vibration leakage due to the winding vibration of the vibrating arms from reaching the bonding location of the support arms through the base so that the CI value can be prevented from increasing. Further, the through-hole is disposed at a location closer to the vibrating arm than the connection portion where the support arms are connected to the base as one body, so that the vibration leakage can be more suppressed without significantly decreasing the rigidity of the base compared to the deeply formed cut portions.

According to a second aspect of the invention, the cut portion is disposed in the base with a distance spaced at least one point two times a width of the support arm from a joint of each of the vibrating arms in the first aspect.

According to the configuration of the second aspect, when the vibrating arms of the tuning fork type vibrating reed wind and vibrate, the range where its vibration leakage is delivered is associated with the arm width W2 of the vibrating arms 35 and 36. Inventors of the invention have focused on this fact to know that the cut portions of the piezoelectric vibrating reed of the related art are not properly disposed. Accordingly, the locations of the cut portions are locations exceeding the arm width W2 of the vibrating arms from the joint portion of the vibrating arms, so that the cut portion can have a structure that vibration leakage from the vibrating arms can be more surely suppressed from being total reflected to the base. Accordingly, the vibration leakage from the vibrating arms to the base can be properly prevented to prevent piezoelectric vibrating reeds having a good drive level characteristic.

In particular, the cut portion is disposed in the base with a distance spaced at least one point two times a width of the support arm from the joint of each of the vibrating arms, so that it is confirmed that the drive level characteristic can be made to be suitable for the normal level of the piezoelectric vibrating reed.

According to a third aspect of the invention, a minimum deformed portion protruded in a plus X direction (i.e., a mechanical axis) is disposed at a side of each of the vibrating arms in any of the first and second aspects.

According to the configuration of the third aspect, when the outer shape of the piezoelectric vibrating reed is formed by wet-etching, the deformed portion generated due to the etching anisotropy is minimized, so that the winding vibration of the vibrating arm can be stable.

According to a fourth aspect of the invention, a length of the support arm is set so that a leading end of the support arm is closer to the base than a leading end of the vibrating arm in any of first to third aspect.

According to the configuration of the fourth aspect, the support arm extends in the same direction as the vibrating arm, and the leading end of the support arm is closer to the base than the leading end of the vibrating arm, so that the total size can be small.

According to a fifth aspect of the invention, the piezoelectric vibrating reed according to any one of first to fourth aspects further includes a long groove formed along a long direction of each of the vibrating arms, and a driver electrode disposed in the long groove. In this case, a reduced width portion where a width of each of the vibrating arms is gradually reduced is present toward the leading end from the base, and a point P of the changed width is in the leading end where the width extends in the same value toward the leaning end or starts to increase, and the point P of the changed width is disposed closer to the leading end of the vibrating arm than the leading end of the long groove.

According to the configuration of the fifth aspect, when the driver electrode (exciting electrode) is formed in the long groove formed in the vibrating arms, the changed point P of the arm width is prepared, which has the gradually reduced width toward the leading end from the base and have the increasing change in the leading end, so that the CI value can be suppressed and the oscillation in the secondary harmonic wave can be prevented. In this case, when it is assumed that the length and arm width of the vibrating arm are not constant, the changed point P can be arranged closer to the leading end of the vibrating arm than the leading end of the long groove in accordance with the piezoelectric vibrating reed, so that the piezoelectric vibrating reed can be provided while suppressing the CI value without degrading the vibration characteristic.

According to a sixth aspect of the invention, the width of each of the vibrating arms has a first reduced width portion having a width rapidly decreasing toward the leading end, and a second reduced with portion having a width gradually decreasing toward the leading end of the reduced width portion from an end of the first reduced with portion at a location of the joint of the vibrating arm with respect to the base in the structure of the fifth aspect.

According to the configuration of the sixth aspect, the second reduced with portion is disposed, which has the gradually reduced arm width of the vibrating arm toward the leading end from the end of the first reduced with portion while the changed point P of the width starting to increase in the leading end is prepared, so that the CI value can be suppressed and the oscillation in the secondary harmonic wave can be prevented.

Further, the first reduced width portion is disposed in the location of the joint where the vibrating arm is connected to the base, which has a rapidly reduced width toward the leading end, so that the biggest stress occurs and the rigidity of the joint portion where the deformation increases can be enhanced when the vibrating arm winds and vibrates. Accordingly, the winding vibration of the vibrating arm become stable and the vibration component is suppressed in the unnecessary direction, so that the CI value can be more reduced. That is, for making the piezoelectric vibrating reed small-sized, the stabilized winding vibration can be implemented to suppress the CI value to a low value.

According to a seventh aspect of the invention, a value of maximum width/minimum width=M as a reduced width rate of the vibrating arm is determined by relationship of a rate of the length of the long groove with respect to the arm length of the vibrating arm=N in the structure of the fifth or sixth aspect.

According to the configuration of the seventh aspect, the value of maximum width/minimum width=M can be associated with the relationship of a rate of the length of the long groove with respect to the arm length of the vibrating arm, so that the piezoelectric vibrating reed without degrading the vibration characteristic can be provided and the CI value can be suppressed for implementing the small size.

According to an eighth aspect of the invention, M is not less than 1.06 when N is about 61% in the structure of the seventh aspect.

According to the configuration of the eighth aspect, when N is 61% for example, M can be made to be not less than 1.06, so that the piezoelectric vibrating reed sufficiently suppressing the CI value of the fundamental wave and simultaneously preventing the secondary harmonic wave from being oscillated.

According to a ninth aspect of the invention, there is provided a piezoelectric device receiving a piezoelectric vibrating reed within a package or a case, the piezoelectric vibrating reed includes: a base formed of a piezoelectric material and having a predetermined length; a plurality of vibrating arms extended from one side of the base; a support arm extended in a width direction from the other side spaced apart from the one side of the base by a predetermined interval and extended outside the vibrating arms in the same direction as the vibrating arms; and a cut portion formed of the piezoelectric material reduced in its width direction at a location closer to the vibrating arms than a connection portion where the support arms are connected to the base as one body. In this case, a through-hole is also disposed at a location closer to the vibrating arms than the connection portion where the support arms are connected to the base as one body.

According to the configuration of the ninth aspect, the impact resistance can be enhanced by the same principle as the first aspect to make good the temperature characteristic, and the total size can be made to be compact, so that the piezoelectric device capable of reducing the CI value can be provided.

BRIEF DESCRIPTION OF THE DRAWINGS

The invention will be described with reference to the accompanying drawings, wherein like numbers reference like elements.

FIG. 10 is a graph illustrating temperature-CI value characteristics of the piezoelectric vibrating reed of FIG. 9.

DESCRIPTION OF THE PREFERRED EMBODIMENTS

Figure 1:
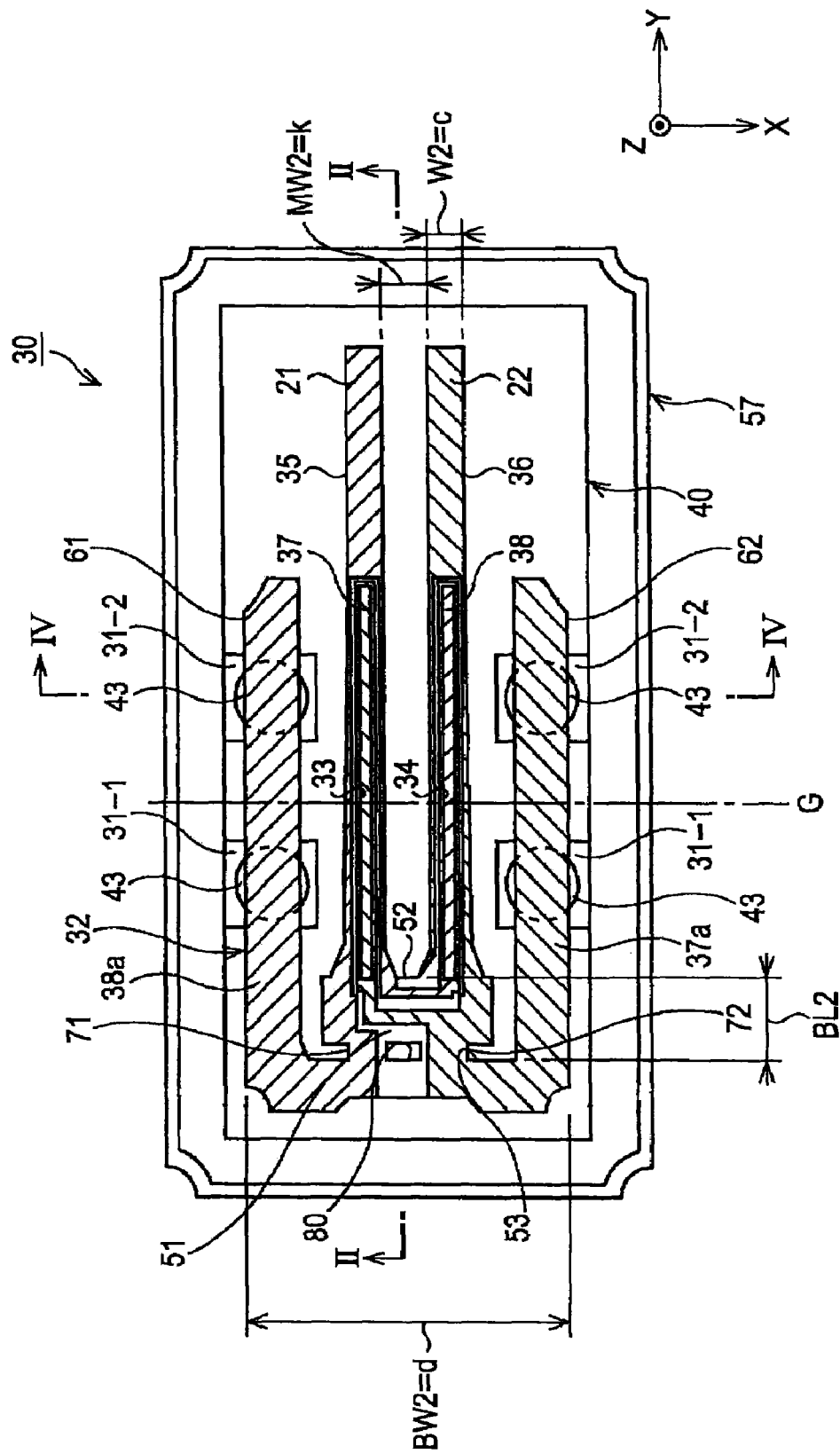
FIG. 1 is a schematic plan diagram of a piezoelectric device according to an embodiment of the invention.
Figure 2:
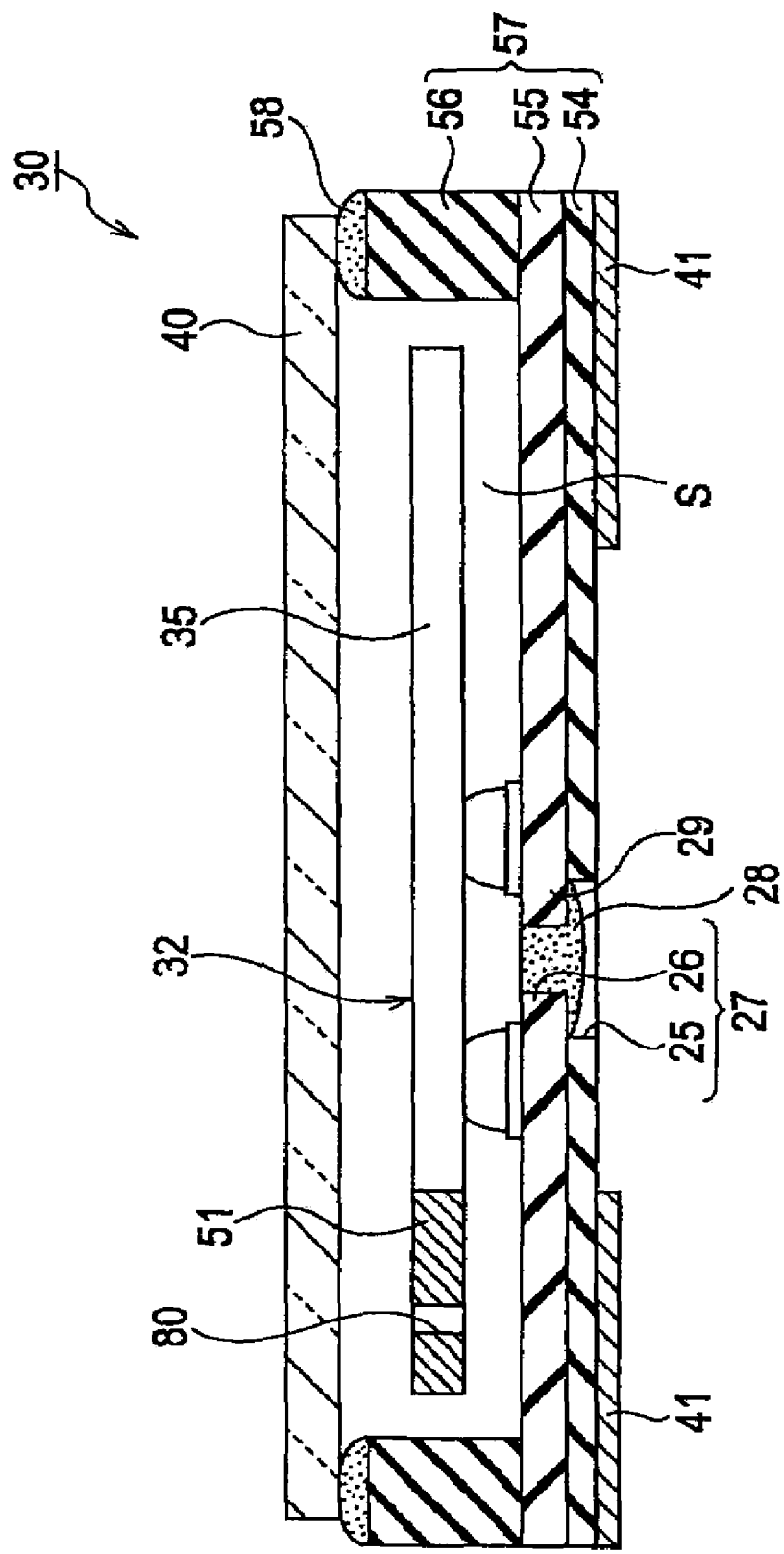
FIG. 2 is a cross-sectional diagram taken out from the line A-A of FIG. 1.
Figure 3:
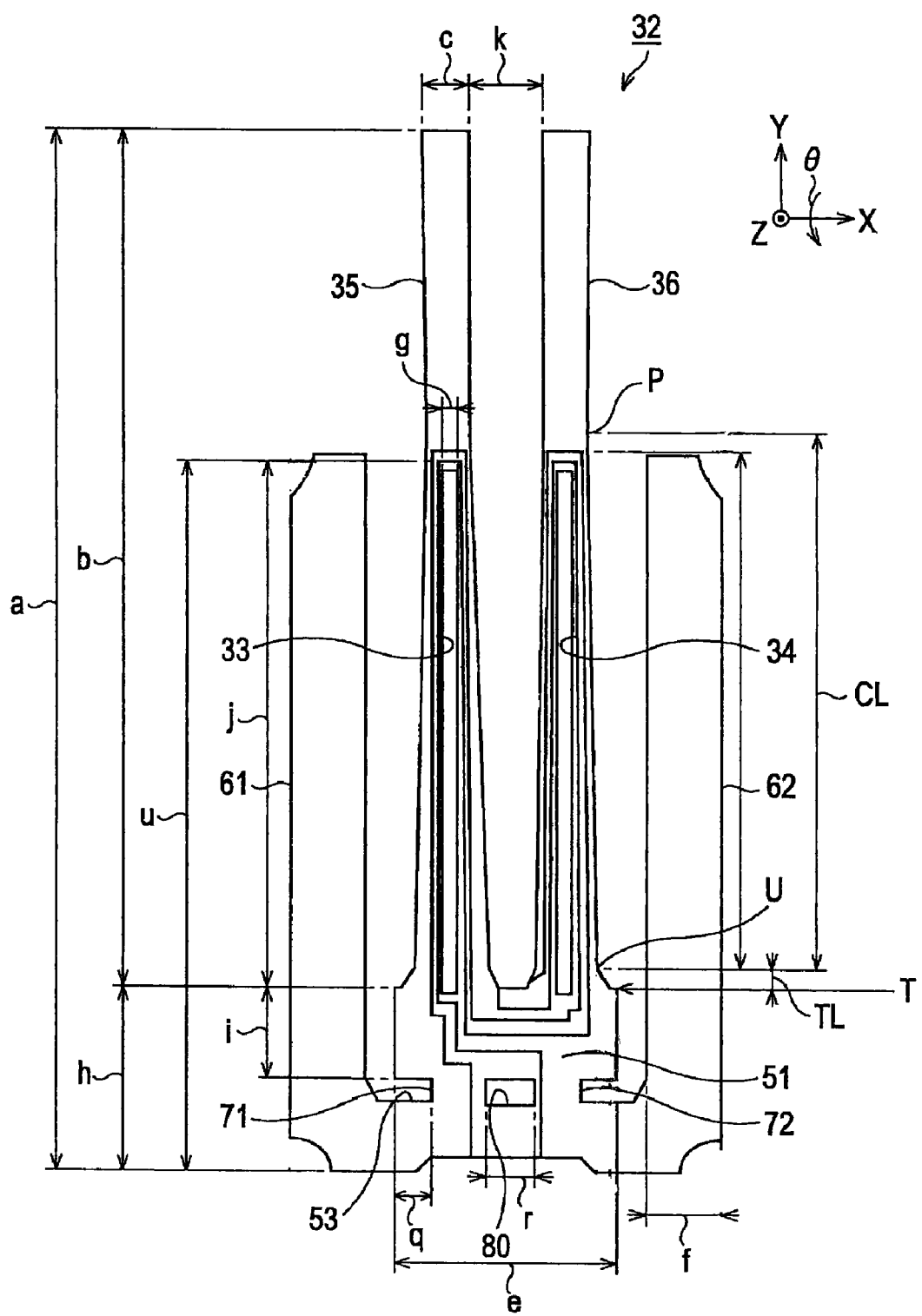
FIG. 3 is a schematic and enlarged plan diagram of a piezoelectric vibrating reed used in the piezoelectric device of FIG. 1.
Figure 4:
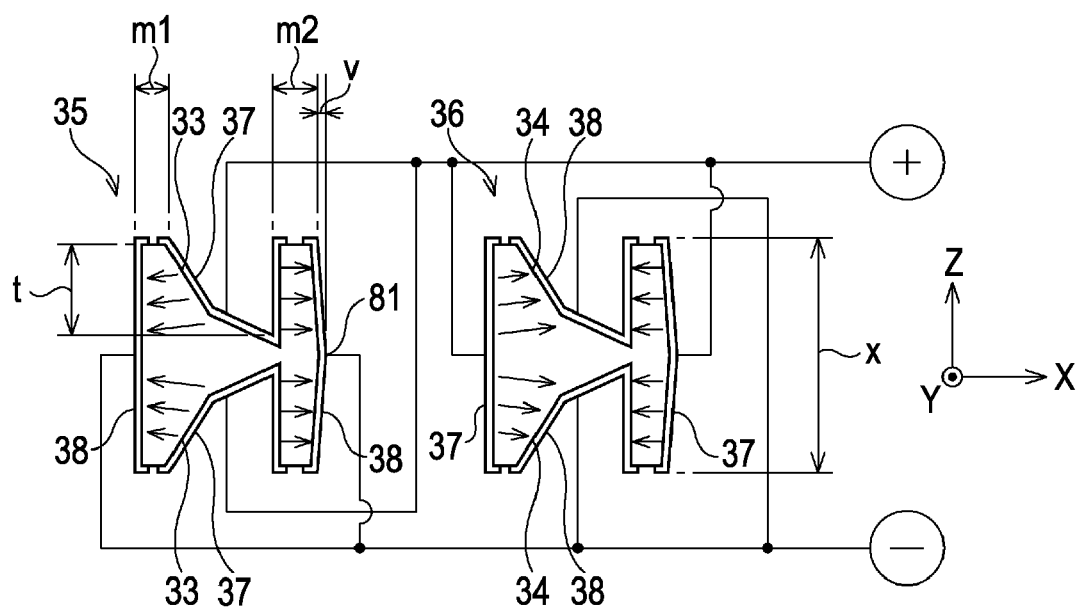
FIG. 4 is a cross-sectional diagram taken out from the line B-B of the vibrating arms of FIG. 1.

FIGS. 1 and 2 show an embodiment of the piezoelectric device of the invention, FIG. 1 is its schematic plan diagram, and FIG. 2 is a cross-sectional diagram taken out from the line II-II of FIG. 1. In addition, FIG. 3 is a schematic and enlarged plan diagram for explaining details of the piezoelectric vibrating reed of FIG. 1, and FIG. 4 is a cross-sectional diagram taken out from the line B-B of the vibrating arms of FIG. 1.

Referring to these Figures, the piezoelectric device 30 is an example of constituting a piezoelectric vibrator, and receives a piezoelectric vibrating reed 32 within a package 57 as a base.

The package 57 has a rectangular box shape as shown in FIGS. 1 and 2. To detail this, the package 57 is formed by stacking a first substrate 54, a second substrate 55, and a third substrate 56, for example, molding a ceramic green sheet formed of an aluminum oxide as an insulting material to the illustrated shape and then carrying out sintering thereon.

A through-hole 27 for degassing in the manufacture process is disposed at a bottom surface of the package 57. The through-hole 27 is composed of first hole 25 formed in the first substrate 54, and a second hole 26 having an outer diameter smaller than the first hole 25 and communicating with the first hole 25.

The through-hole 27 is charged by an encapsulant 28 so that the package 57 is hermetically encapsulated.

In the package 57, an inner material of the second substrate 56 is removed in the package to form an inner spacer S as shown in FIG. 2. This inner spacer S is one for receiving the piezoelectric vibrating reed 32. Extraction electrode formation locations of support arms of (to be described later) the piezoelectric vibrating reed 32 are put are put on and bonded with each of electrode portions 31-1, 31-2, 31-1, and 31-2 formed on the second substrate 55 by conductive adhesives 43, 43, 43, and 43. The support arm 61 and the support arm 62 have the same shape as each other, so that the description will be given in terms of the support arm 61 with reference to FIG. 3. It is required that the length value u of the support arm 61 is 60% to 80% of the total length of the piezoelectric vibrating reed 32 for having a stabilized support structure.

In this case, although not shown, a location or a structure which has reduced the rigidity, e.g., a cut portion or a reduced width portion may be disposed in some of the location between the support arm 61 and the base 51.

Accordingly, reduction in CI value can be expected. In addition, outer corner portions of the support arms 61 and 62 are inward or outward chamfered as convex R shapes to prevent damage such as dislocation.

One location only corresponding to a central position G of the length value of the piezoelectric vibrating reed 32 may be selected for bonding with, for example, the support arm 61 of one side. However, when two locations spaced apart from the central position with the central position disposed therebetween are selected to set and bond with the electrode portions 31-1 and 31-2, a more enhanced bonding structure is preferably obtained.

When one support arm is bonded with one location, it is preferable to secure the length of the adhesive applied region not less than 25% of the total length (a) of the piezoelectric vibrating reed 32 for obtaining a sufficient bonding strength.

When two bonding locations are arranged in the present embodiment, it is preferable that an interval between the bonding locations is not less than 25% of the total length (a) of the piezoelectric vibrating reed 32 for obtaining a sufficient bonding strength.

In addition, after the piezoelectric vibrating reed 32 is fixed by the conductive adhesive 43, a residual stress exists in the base 51 due to a difference between linear expansion coefficients of a material forming the piezoelectric vibrating reed 32 and of a material forming the package 57.

Further, among electrode portions 31-1, 31-2, 31-1, and 31-2, at least one set of electrode portions 31-1 and 31-2 are connected to mounting terminals 41 and 41 disposed at a rear side of the package via a conductive through-hole or the like. The package 57, after receiving the piezoelectric vibrating reed 32, allows the cover formed of glass to be bonded with the encapsulant 58 so that it is hermetically encapsulated in vacuum.

Accordingly, after the cover 40 is encapsulated, laser lights are externally radiated to trim the electrode of the piezoelectric vibrating reed 32 so that the frequency can be adjusted.

In addition, the cover 40 may have a structure that a metal plate formed of e.g., cobalt is bonded by seam encapsulation. The piezoelectric vibrating reed 32 is, for example, formed of quartz. However, other materials such as, for example, $LiTaO_3$ or $LiNbO_3$ may be employed as the piezoelectric material. In the present embodiment, the piezoelectric vibrating reed 32 is cut from single crystals of quartz to be described later.

The piezoelectric vibrating reed 32, as shown in FIG. 1, has a base 51, and a pair of vibrating arms 35 and 36 which are divided into two pieces and extend in the right direction in parallel with each other from one end (i.e., the right end of FIG. 1) of the base 51.

Long grooves 33 and 34 are preferably disposed in both surfaces of the respective vibrating arms 35 and 36, and exciting electrodes 37 and 38 as driver electrodes are disposed within the long grooves as shown in FIGS. 1 and 2.

In addition, in the present embodiment, leading ends of the respective vibrating arms 35 and 36, as described later, have gradually reduced widths as taper shapes to be more weighted, so that they act as weights. Accordingly, winding vibration of the vibrating arm is facilitated.

In addition, the piezoelectric vibrating reed 32 has support arms 61 and 62 which extend in a width direction of the base 51 in the other end (the left side of FIG. 1) spaced apart from the one end where the vibrating arm of the base 51 is disposed by a predetermined interval BL2 (base length) in FIG. 1 and extend in a direction (the right side of FIG. 1) of each of the vibrating arms 35 and 36 at both of outer sides of the vibrating arms 35 and 36 in parallel with each other.

The outer shape of the piezoelectric vibrating reed 32 as a tuning fork shape, and the long groove disposed in each of the vibrating arms may be accurately formed by wet-etching or dry-etching a quartz wafer with an HF solution.

As shown in FIGS. 1 and 3, the exciting electrodes 37 and 38 are disposed at sides of the respective vibrating arms, and have an electrode disposed in the long grooves 33 and 34 and an electrode disposed at the side as one pair with respect to the vibrating arms. And the exciting electrodes 37 and 38 are surrounded as extraction electrodes 37a and 38a by the support arms 61 and 62, respectively. Accordingly, when the piezoelectric device 30 is mounted on a mounting substrate, an external drive voltage is delivered from the mounting terminal 41 to the respective extraction electrodes 37a and 38a of the support arms 61 and 62 of the piezoelectric vibrating reed 32 through the electrode portions 31 and 31 (31-1 and/or 31-2, 31-1 and/or 31-2), which are then delivered to the respective exciting electrodes 37 and 38.

However, when the drive voltage is applied to the exciting electrodes within the long grooves 33 and 34, an electric field efficiency within the region where the long grooves of the respective vibrating arms are disposed can be enhanced at the time of driving.

That is, as shown in FIG. 4, the exciting electrodes 37 and 38 are connected to an alternating current power supply by cross interconnections, and an alternating voltage as a drive voltage is applied from the power supply to each of the vibrating arms 35 and 36.

Accordingly, the vibrating arms 35 and 36 are excited so as to have reverse phases each other, and are wound and vibrated so as to have leading ends of the vibrating arms 35 and 36 closer or spaced apart from each other.

In this case, a fundamental wave of the piezoelectric vibrating reed 32 has, for example, a Q value of 12000, a capacity ratio (C0/C1) of 260, a CI value of 57 kΩ, and a frequency of 32,768 KHz.

In addition, a secondary harmonic wave has, for example, a Q value of 28000, a capacity ratio (C0/C1) of 5100, a CI value of 77 kΩ, and a frequency of 207 KHz.

In addition, convex portions or cut portions 71 and 72 which have partially reduced widths of the base 51 in the width direction of the base are disposed at both edges of the location sufficiently spaced apart from the end of the vibrating arm of the base 51. Depths of the cut portions 71 and 72 (i.e., q of FIG. 3) preferably have a value enough to match the outer edge of the vibrating arms 35 and 36 closest to the respective cut portions, for example, about 30 μm.

Accordingly, the CI value can be suppressed at a low value by suppressing the vibration leakage from total reflecting to the support arms 61 and 62 when the vibrating arms 35 and 36 are wound and vibrated to leak into the base 51.

However, when the depth values of the cut portions 71 and 72 are made to increase, the vibration leakage can be reduced but the rigidity of the base 51 itself unnecessarily decreases, which thus degrades the stability of the winding vibration of the vibrating arms 35 and 36.

Accordingly, in the present embodiment, a through-hole 80 is disposed at a location near the vibrating arms 35 and 36, that is, closer to a center of the width direction of the base 51 than the connection portion where the support arms 61 and 62 are connected to the base 51 as one body.

The through-hole 80, as shown in FIGS. 1 and 2, has a rectangular hole penetrating both surfaces of the base 51, and the shape is not limited thereto but circle, ellipse, or square may be used instead. Accordingly, the vibration leakage can be more suppressed to reduce the CI value without significantly decreasing the rigidity of the base 51 compared to the deeply formed cut portions 71 and 72.

In this case, the length of the through-hole 80 in the width direction of the base 51 is preferably about 50 μm, however, a rate of the value (r) of the through-hole 80 and the value (e) of the depth (q) of the cut portion 71 with respect to the value (e), that is, (r+q)/e is 30% to 80%, so that the vibration leakage can be advantageously reduced and the effect on the bonded location where the support arm 61 is interposed can be reduced.

Additionally, in order to have a low package value, an interval (q) between the side of the base 51 and the support arms 61 and 61 is 30 μm to 100 μm.

In addition, as shown in FIG. 1, the location where the above-described support arms 61 and 62 extend, that is, the other end 53 (connection portion) of the base 51 has a distance BL2 sufficiently spaced from the joint portion 52 of the vibrating arms 35 and 36 in the present embodiment.

This distance BL2 preferably has a value exceeding the value of the arm width W2 of the vibrating arms 35 and 36.

That is, when the vibrating arms 35 and 36 of the tuning fork type vibrating reed wind and vibrate, the range where its vibration leakage is delivered toward the base 51 is associated with the arm width W2 of the vibrating arms 35 and 36. Inventors of the invention have focused on this fact to know that the location to be the base end of the support arts 61 and 62 should be disposed at a proper position.

Accordingly, the joint portion 52 of the vibrating arms is made to be the starting point with respect to the location 53 (connection portion) which is the base end of the support arms 61 and 62, and a location exceeding the value corresponding to the arm width W2 of the vibrating arm is selected, so that the vibration leakage from the vibrating arms 35 and 36 can be surely suppressed from being totally reflected to the support arms 61 and 62 in the present embodiment. Accordingly, in order to suppress the CI value and have an effect of the support arms to be described later, the location 53 is preferably spaced apart from the location of the joint portion 52 (that is, one end of the base 51) of the vibrating arms 35 and 36 by the distance BL2.

The same reason can be applied as follows. The locations of the cut portions 71 and 72 are preferably locations exceeding the arm width W2 of the vibrating arms 35 and 36 from the location of the joint portion 52 of the vibrating arms 35 and 36. Accordingly, the cut portions 71 and 72, including the location where the support arms 61 and 62 are connected to the base 51 as one body, are disposed at a location near the vibrating arms. In addition, the locations of the cut portions 71 and 72 are preferably locations spaced apart from the location of the joint portion by the arm width W2×1.2 or more, so that it is confirmed that the drive level characteristic can be suitably applied to the level of the piezoelectric vibrating reed.

In addition, the support arms 61 and 62 are not associated with the vibration so that there are no specific conditions on the arm width, however, it may have a larger width than the vibrating arm for securely having a support structure.

Figure 9:
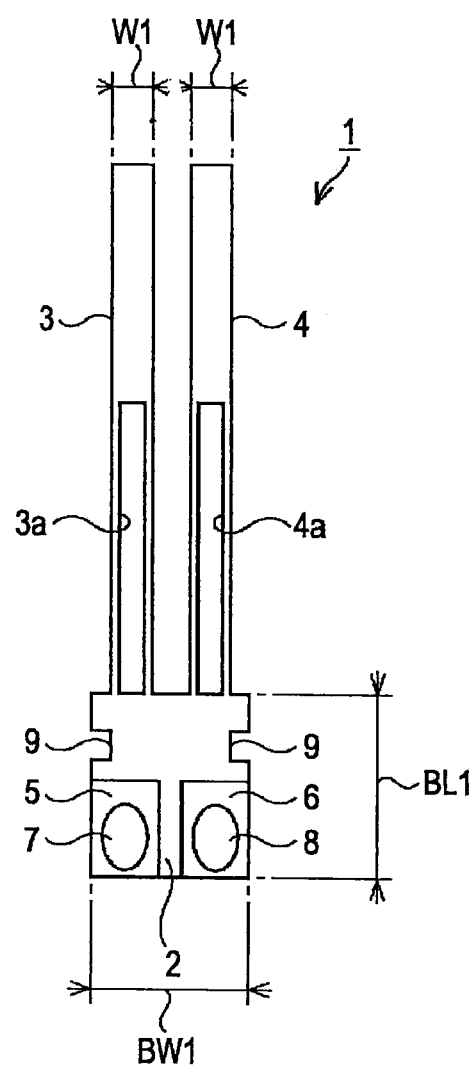
FIG. 9 is a schematic plan diagram of a piezoelectric vibrating reed of the related art.

By doing so, in the present embodiment, a width W2 of the vibrating arms is about 40 µm to about 60 µm, an interval MW2 between the vibrating arms is about 50 µm to about 100 µm, and a width of the support arms 61 and 62 is about 100 µm, so that the width BW2 of the base 51 can be set to 500 µm, which can be sufficiently received in the package having almost the same width as and a shorter length than the piezoelectric vibrating reed 1 of FIG. 9 and having the same size as the related art. The present embodiment trying to have such miniaturization, can have the effect as follows.

Referring to the piezoelectric vibrating reed 32 of FIG. 1, the support arms 61 and 62 are bonded to the package 57 by the conductive adhesive 43, the change in stress occurring on in the bonded location due to the change in ambient temperature or dropped impact hardly affects the vibrating arms 35 and 36 by having the wound distance from the bonded location of the support arms 61 and 62 to the other end 53 of the base 51 spaced apart from the distance corresponding to the length exceeding the distance BL2 of the base 51, so that the temperature characteristic becomes particularly good.

In contrast, the vibration leakage from the vibrating arms 35 and 36 which wind and vibrate is hardly affected by having the distance BL2 to the support arms 61 and 62 which has spaced the base 51 by a predetermined length of the base 51 exceeding the distance BL2.

In this case, when the length of the base 51 is extremely short, a strong component of the winding vibration is delivered to the whole support arms 61 and 62 to make the control difficult, however, according to the present embodiment, such a problem is sufficiently avoided.

In addition to such operations, the support arms 61 and 62 extend in a width direction from the other end 53 (connection portion) of the base 51 as shown in the Figure and extend in the same direction as the vibrating arms outside the vibrating arms 35 and 36, so that the total size can be made to be compact.

In addition, as shown in FIG. 1, leading ends of the support arms 61 and 62 are disposed closer to the base 51 than the leading ends of the vibrating arms 35 and 36 in the present embodiment. Accordingly, the size of the piezoelectric vibrating reed 32 can also be made to be compact.

Further, as compared to the structure of FIG. 9, it can be easily understood that the extraction electrode 5 and the extraction electrode 6 close to each other are bonded by applying the conductive adhesives 7 and 8 in FIG. 9, so that the adhesive should be applied (to the package) in a very small range to avoid a short-circuit problem, and the bonding process should be carried out while avoiding the short-circuit due to the leaked adhesive prior to curing after bonding, so that it was not an easy process.

However, the conductive adhesives 43 and 43 are applied to the electrode portions 31-1 and 31-2 corresponding to central positions of the respective support arms 61 and 62 which are sufficiently spaced apart from each other in the width direction in the package 57, so that the above-described problem hardly occurs and the short-circuit does not occur.

Figure 6:
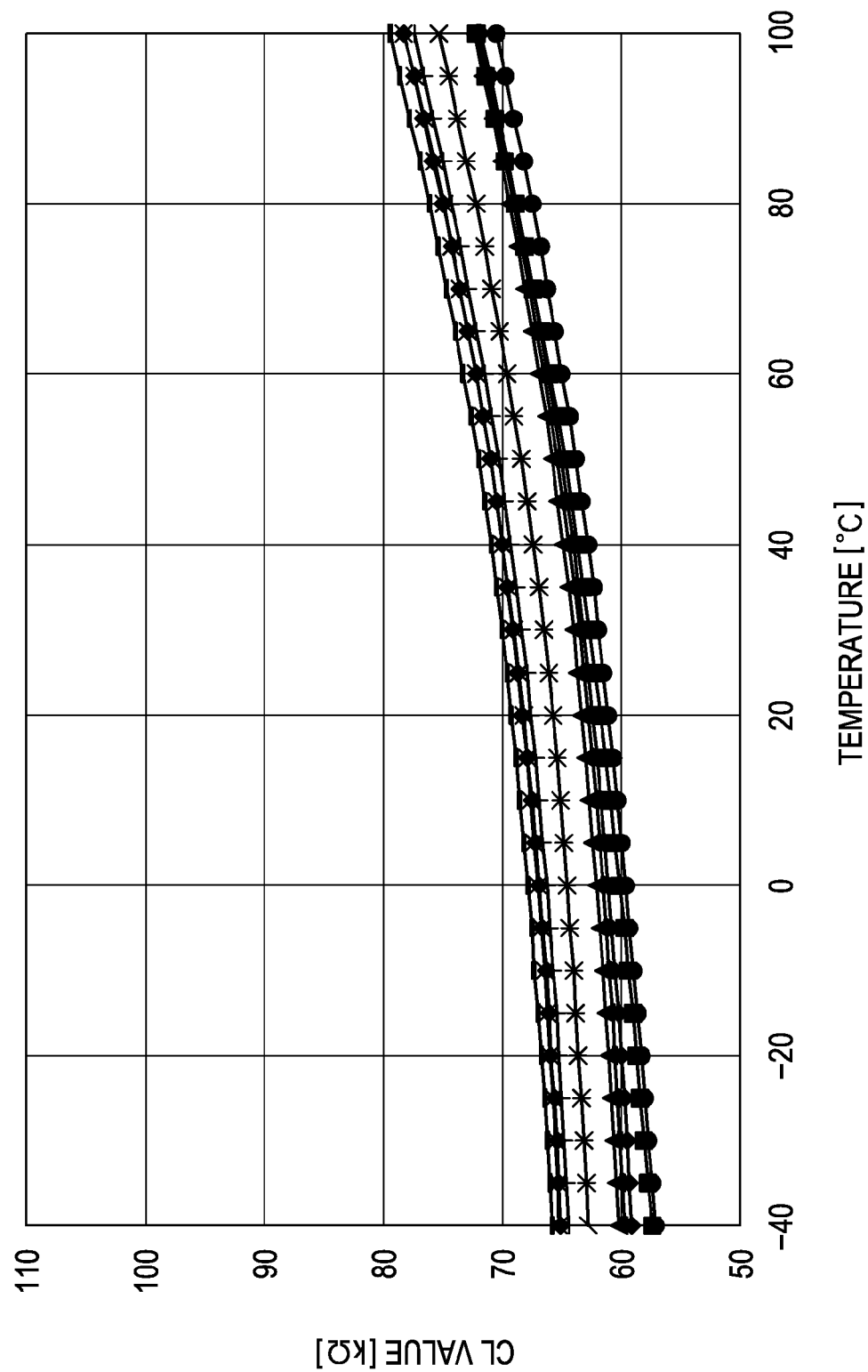
FIG. 6 is a graph illustrating temperature-CI value characteristics of the piezoelectric vibrating reed used in the piezoelectric device of FIG. 1.

FIG. 6 illustrates a temperature characteristic of the piezoelectric vibrating reed 32 of the present embodiment, particularly, illustrates the temperature-CI value characteristics.

As shown in FIG. 6, it can be easily understood that the temperature-CI value characteristics of FIG. 6 are better than FIG. 10.

Next, a preferred and detailed structure of the piezoelectric vibrating reed 32 of the present embodiment will be described with reference to FIGS. 3 and 4.

The vibrating arms 35 and 36 of the piezoelectric vibrating reed 32 shown in FIG. 3 have the same shape as each other, so that the description will be given in terms of the vibrating arm 36, which has the largest width in the base portion T where the respective vibrating arms extend from the base 51. A first reduced width portion TL is formed, which has a rapidly reduced width in a location between the location T as the joint portion of the vibrating arm 36 and a location U spaced from the leading end of the vibrating arm by a short distance. And a second reduced width potion is formed, which has a gradually reduced width from the location U of the end of the first reduced width portion to the location P toward the leading end of the vibrating arm 36, that is, over the distance CL with respect to the vibrating arm.

Accordingly, the vibrating arm 36 has a high rigidity by arranging the first reduced with portion TL around the joint close to the base. In addition, the second reduced width portion CL is formed toward the leading end from the end U of the first reduced with portion, so that the rigidity continuously decreases. The location P is the changed point of the width and has a concave shape in the vibrating arm 36, so that it may be expressed as the concave location P. The leading end more than the changed point P of the arm width extends with the same arm width, or gradually enlarges in the vibrating arm 36 as shown in FIG. 3.

In this case, when the long grooves 33 and 34 of FIG. 3 are longer, the electric field efficiency of the material forming the vibrating arms 35 and 36 is enhanced. In this case, it can be found that the CI value of the toning fork type vibrating reed decreases when the length (j) from the base 51 of the long grooves 33 and 34 increases up to j/b=about 0.7 with respect to the total length (b) of the vibrating arm. The total length (b) of the vibrating arm 36 of FIG. 3 is, for example, about 1200 µm in the present embodiment.

In addition, when the length of the long groove is made to be properly long to sufficiently suppress the CI value, the CI value ratio of the piezoelectric vibrating reed (CI value of the harmonic wave/CI value of the fundamental wave) becomes problematic as follows. That is, when the CI value of the fundamental wave decreases while the CI value of the harmonic wave is suppressed to have the CI value of the harmonic wave smaller than the CI value of the fundamental wave, oscillation is quite liable to occur due to the harmonic wave.

Accordingly, the long groove is made to be long to decrease the CI value and the changed point P of the arm width is simultaneously arranged close to the leading end of the vibrating arm, so that the CI value can decrease and the CI value ratio (CI value of the harmonic wave/CI value of the fundamental wave) can be greater.

That is, the fundamental portion of the vibrating arm 36, that is, the joint portion has its enhanced rigidity by the first reduced width portion TL. Accordingly, the winding vibration of the vibrating arm can be more stabilized so that the CI value can be suppressed along with the formation of the through-hole 80.

Further, because of the second reduced with portion CL, the vibrating arm 36 has its rigidity which gradually decreases from the location near the joint portion up to the concave location P as the changed point of the arm width toward the leading end, so that the long groove 34 does not exist in the more leading end from the concave location P and the arm width gradually enlarges to have the rigidity increased toward the leading end.

Accordingly, it can be considered that the node of the vibration in the secondary harmonic wave is positioned at the more leading of the vibrating arm 36, so that the CI value of the secondary harmonic wave is not degraded while suppressing the CI value of the fundamental wave even when the long groove 34 is made to be long to increase the electric field efficiency of the piezoelectric material to thereby increase the CI value. Accordingly, the changed point P of the width can be arranged to the more leading end of the vibrating arm than the leading end of the long groove, so that the CI value ratio can be surely made to be great to prevent the oscillation due to the harmonic wave as shown in FIG. 3.

Furthermore, according to the research of the inventors, when j is the length of the long grooves 33 and 34 from the base 51 and b is the total length of the vibrating arm, j/b, the reduced with rate M of the arm width as the maximum/minimum width of the vibrating arm 36, and the CI value ratio (CI value of the secondary harmonic wave/CI value of the fundamental wave) corresponding to the same are associated with each other.

When j/b is 61.5%, it is confirmed that the CI value ratio can be greater than 1 by having the width reduced rate M as the maximum/minimum width of the vibrating arm 36 greater than 1.06 so that the oscillation due to the harmonic wave is prevented. By doing so, even when the total is small-sized, the CI value of the fundamental wave can be suppressed to a low value, so that the piezoelectric vibrating reed can be provided without degrading the drive characteristic.

Next, a more preferred structure of the piezoelectric vibrating reed 32 will be described.

A thickness of the wafer denoted by the value x of FIG. 4, that is, a thickness of the quartz wafer forming the piezoelectric vibrating reed is preferably in a range of 70 μm to 130 μm.

The total length of the piezoelectric vibrating reed 32 denoted by the value a of FIG. 3 is about 1300 μm to about 1600 μm. It is preferable to make the piezoelectric device small-sized when the value b as the total length of the vibrating arm is 1100 μm to 1400 μm and the whole width of the piezoelectric device 30 is 400 μm to 600 μm. Accordingly, in order to make the toning fork portion small-sized, the width (e) of the base 51 needs to be 200 μm to 400 μm and the width (f) of the support arm needs to be 300 μm to 100 μm for securely having a support effect.

In addition, the value (k) between the vibrating arms 35 and 36 of FIG. 3 is preferably 50 μm to 100 μm. When the value (k) is less than 50 μm, it is difficult to make sufficiently small a deformed portion based on the etching anisotropy, that is, a convex potion having a fin shape in the plus X direction in the vibrating arm denoted by the reference numeral 81 of FIG. 4 when an outer shape of the piezoelectric vibrating reed 32 is formed by penetrating the quartz wafer with wet etching as described later. When the value (k) is not less than 100 μm, the winding vibration of the vibrating arm may be unstable.

Further, values m1 and m2 of the outer edge of the long groove 33 and the outer edge of the vibrating arm in the vibrating arm 35 (and also in the vibrating arm 36) of FIG. 4 are preferably 3 μm to 15 μm. When the values m1 and m2 are not more than 15 μm, the electric field efficiency is enhanced, and when the values m1 and m2 are not less than 3 μm, the electrode polarization can be surely and advantageously carried out.

Referring to the vibrating arm 36 of FIG. 3, when the width (n) of the first reduced with portion TL is not less than 11 μm, it can be expected that the CI value be surely suppressed.

Referring to the vibrating arm 36 of FIG. 3, the degree of arm width of which the leading end is enlarged more than the changed point P of the arm with preferably increases to 0 to 20 μm with respect to the width of the location of the changed point P which is the location where the arm width of the vibrating arm 36 is minimum. When the width is enlarged to be exceeded, the leading end of the vibrating arm 36 becomes so heavy so that the stability of the winding vibration may be affected.

In addition, the deformed portion 81 protruded as fin shape in the plus X direction is disposed at one outer surface of the vibrating arm 35 (and also in the vibrating arm 36) of FIG. 4. This is formed as a residue by means of the etching anisotropy of the quartz when the outer shape of the piezoelectric vibrating reed is formed by wet-etching, however, a protruded amount (v) of the deformed portion 81 is preferably made to decrease by etching with the etchant having HF and ammonium fluoride for 9 to 11 hours so that the electric field efficiency is enhanced and the CI value is suppressed to a low value.

The width of the long groove denoted by g of FIG. 4 is preferably about 60% to about 90% of the arm width (c) of the vibrating arm in the region where the long groove of the vibrating arm is formed. The first and second reduced width portions are formed in the respective vibrating arms 35 and 36, so that the width (g) of the long groove is about 60% to 90% of the maximum width of the vibrating arm even when the arm width C is different in accordance with the longitudinal direction of the vibrating arm. When the width of the long groove decreases more than that, the electric field efficiency is degraded to cause the CI value to increase.

In addition, the location of the side end of the base 51 of the long grooves 33 and 34 is preferably the same as the joint portion of the vibrating arms 35 and 36, that is, the location T or in a range where the first reduced width portion TL exists a little more closer to the leading end of the vibrating arm than the same location, and in particular, is the location that is not closer to the base end of the base 51 than the location T.

Further, the total length (h) of the base 51 of FIG. 4, compared to about 30% of the total length (a) of the piezoelectric vibrating reed 32 of the related art, can be in a range of about 15% to 25% by employing the cut portion or the like in the present embodiment, thereby implementing the miniaturization.

Figure 5:
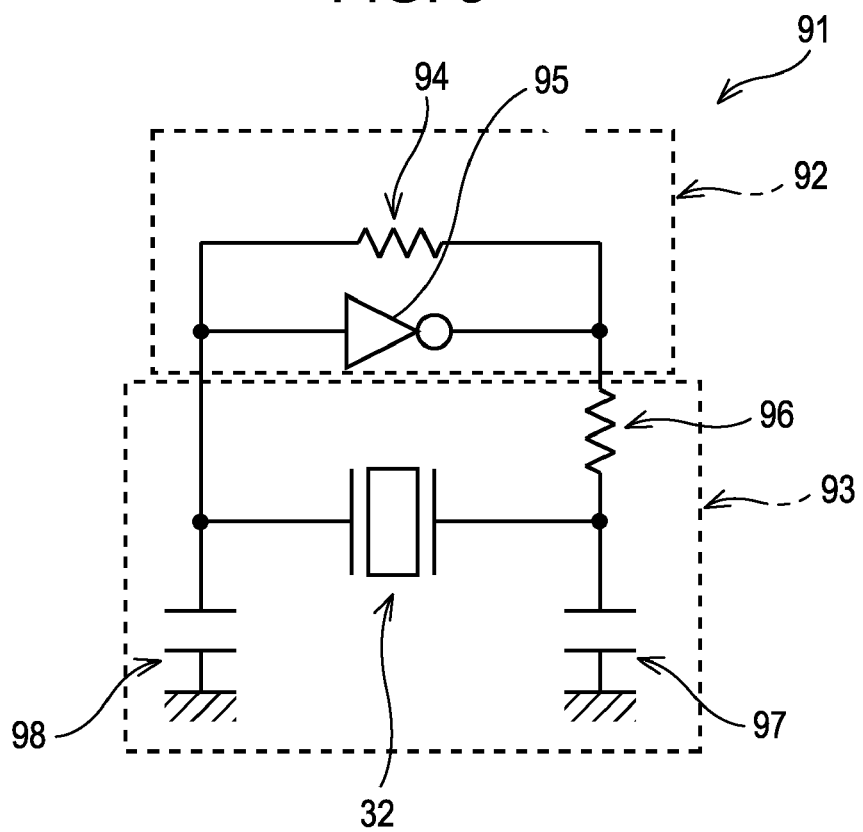
FIG. 5 is a circuit diagram illustrating an oscillation circuit using a piezoelectric vibrating reed of FIG. 1.

FIG. 5 illustrates a circuit diagram of an example of the oscillation circuit when the piezoelectric oscillator is configured using the piezoelectric vibrating reed 32 of the present embodiment.

The oscillation circuit 91 includes an amplification circuit 92 and a feedback circuit 93.

The amplification circuit 92 is composed of an amplifier 95 and a feedback resistor 94. The feedback circuit 93 is composed of a drain resistor 96, condensers 97 and 98, and the piezoelectric vibrating reed 32.

In this case, the feedback resistor 94 of FIG. 5 may have a value of about 10 mΩ, and the amplifier 95 may use a Complementary Metal Oxide Semiconductor (CMOS). The drain resistor 96 may have a value of 200 kΩ to 900 kΩ, and each of the condensers 97 and 98 may have values of 10 to 22 pF.

Method of Manufacturing Piezoelectric Device

Figure 7:
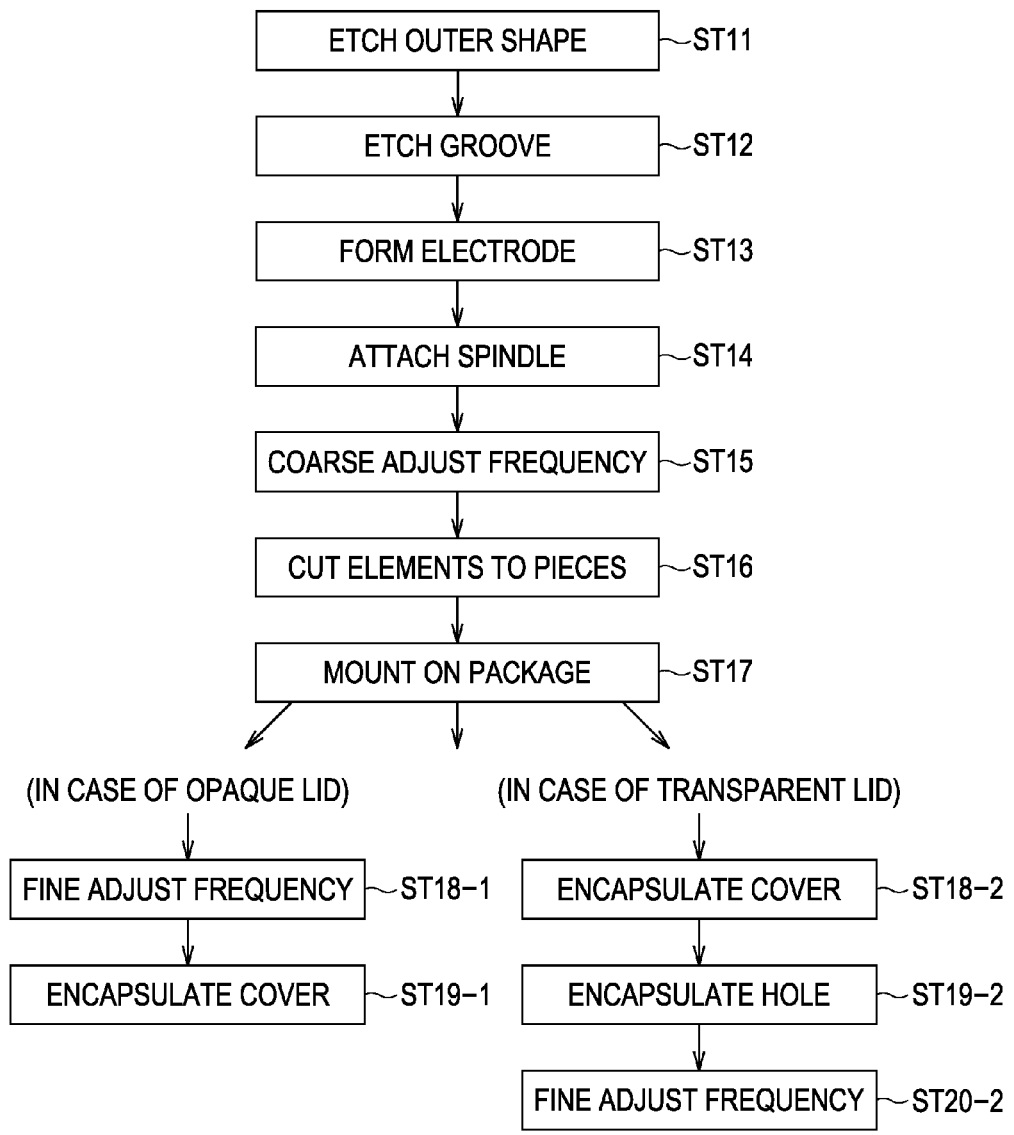
FIG. 7 is a flow chart illustrating an example of a method of manufacturing the piezoelectric device of FIG. 1.

An example of the method of manufacturing the above-described piezoelectric device will be described with reference to the flow chart of FIG. 7.

The piezoelectric vibrating reed 32 the piezoelectric device 30, the package 57, and the cover 40 are separately manufactured.

Method of Manufacturing Cover and Package

The cover 40 is prepared by cutting a glass substrate having a predetermined size so that it has a size suitable for encapsulating the package 57.

The package 57 is formed by molding the ceramic green sheet of an aluminum oxide to form a substrate and stacking a plurality of the substrates and carrying out sintering thereon. At the time of molding, each of the substrates has a predetermined hole inside to form a predetermined inner space S when they are stacked.

Method Of Manufacturing Piezoelectric Vibrating Reed

A piezoelectric substrate is first prepared, and outer shapes of a predetermined number of piezoelectric vibrating reeds are simultaneously formed by etching from the piezoelectric substrate (outer etching).

Figure 8:
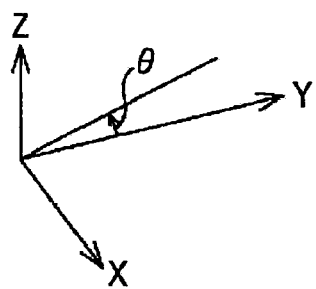
FIG. 8 is a diagram illustrating coordinate axes of a quartz Z plate.

In this case, among piezoelectric materials, a quartz wafer having a size allowing the piezoelectric vibrating reeds 32 to be divided plurally or in several is employed for the piezoelectric substrate. The piezoelectric substrate has the piezoelectric vibrating reed 32 of FIG. 3 formed by the process, so that it is cut from the piezoelectric material, e.g., single crystal of quartz so as to have the x axis as an electric axis, the Y axis as a mechanical axis, and the z axis as an optical axis. In addition, when it is cut from the single crystal of quartz, the quartz z plate rotated and cut from the range of 0° to 5° (θ of FIG. 8) in a clockwise direction based on the z axis as an origin may be cut and polished in the orthogonal coordinate composed of the above-described x, t, and z axes.

As for the outer etching, the outer etching is carried out on the piezoelectric vibrating reed using a mask such as corrosion resistant layer (not shown) and an HF solution as an etchant in the exposed piezoelectric substrate as the outer portion from the outer shape of the piezoelectric vibrating reed. A metal layer where the gold is deposited using chrome as foundation may be employed as the corrosion resistant layer. This etching process is a wet etching, and is varied by concentration or kind of the HF solution, temperature, or the like. In this case, an etching anisotropy is presented during the etching with respect to the mechanical axis X, the electrical axis Y, and the optical axis Z in the wet etching of the outer shape etching process.

That is, an etching rate of the x-y plane in the piezoelectric vibrating reed 32 is fast at 120° and minus 120° in a plus X axis direction, and is slow in a plus 30° and a minus 30° with respect to the minus X direction.

In the same way, the etching of the Y direction is fast in plus 30° and minus 30°, and is slow in plus 120° and minus 120° in the plus Y direction.

By means of such an anisotropy during the etching, a deformed portion protruded as fin shape is formed at an outer surface of each of the vibrating arms as denoted by reference numeral 81 of FIG. 4 in the piezoelectric vibrating reed 32.

However, etching is carried out using HF and ammonium fluoride as an etchant for a sufficient time, that is, 9 hours to 11 hours in the present embodiment, so that the deformed portion 81 of FIG. 4 can be made to very small-sized (ST11).

In this process, not only the outer shapes including the cut portions 71 and 72 of the piezoelectric vibrating reed 32 but also the through-hole 80 is simultaneously formed, so that outer shapes of several piezoelectric vibrating reeds 32 connected close to the base 51 by respective narrow connection potions are completed at the end of etching.

Half Etching Process For Forming Groove

A register for forming the groove (not shown) allows walls at both sides of the long groove to be left so as to have the shape shown in FIG. 4 to have the corrosion resistant layer remain in the portion where the groove is not formed, and the same etching condition as the outer shape etching is applied to the front and rear surfaces of each of the vibrating arms 35 and 36 so that a bottom portion corresponding to the long groove is formed by wet-etching (ST12).

In this case, the groove depth denoted as t is about 30% to 45% with respect to the total thickness x in FIG. 4. When t is not greater than 30% of the total thickness x, the electric field efficiency cannot be sufficiently enhanced. When t is not less than 45%, the rigidity is insufficient to adversely affect the winding vibration or have an insufficient strength.

Further, any one or both of the outer shape and the groove may be formed by dry-etching. In this case, the outer shape of the piezoelectric vibrating reed 32, or a region corresponding to the long groove after the outer shape is formed on the piezoelectric substrate (quartz wafer) is covered by a metal mask. In this case, an etching gas may be supplied into a chamber (not shown) with a predetermined degree of vacuum to generate an etching plasma for dry-etching. That is, a freon gas bombe and an oxygen gas bombe are connected to a vacuum chamber (not shown), and an exhaust tube is arranged in the vacuum chamber so that it is in a vacuum state having a predetermined degree of vacuum.

The vacuum chamber is evacuated with the predetermined degree of vacuum and the freon gas and the oxygen gas are supplied thereto and the resultantly mixed gas is charged until reaching a predetermined pressure. When a direct current voltage is applied thereto at that moment, the plasma is generated. The mixed gas containing ionized particles corresponds to the piezoelectric material exposed from a metal master. By means of this impact, it is physically cut and flied off so that the etching is carried out.

Electrode Formation Process

A metal to be an electrode, for example, gold is applied over the entire surface by deposition or sputtering, and then driver electrodes described with reference to FIGS. 1 and 4 are formed in the location where the electrode is not present by the photolithography method using the exposed register (ST13). Weight attached electrodes 21 and 21 (metal layers) are then formed at the leading ends of the respective vibrating arms 35 and 36 by sputtering or deposition (ST14). The weight attached electrodes 21 and 22 are in an electrically conductive state and are not employed for driving the piezoelectric vibrating reed 32 but employed for adjusting the frequency to be described later.

The coarse frequency adjustment is then carried out on the wafer (ST15). The coarse frequency adjustment radiates energy beam such as laser lights on some of the weight attached electrodes 21 and 21 to make them partially evaporated using a mass reduction manner. Subsequently, a narrow connection potion is folded with respect to the wafer to make the piezoelectric vibrating reeds 32 pieces (ST16).

The conductive adhesives 43, 43, 43, and 43 are then applied to the respective electrode portions 31-1, 31-2, 31-1, and 31-2 of the package 57 as described with reference to FIG. 1, and the support arms 61 and 62 are put thereon, and the adhesives are heated and cured to bond the piezoelectric vibrating reed 32 with the package 57 (ST17).

Furthermore, the conductive adhesive 43 is a material that conductive particles such as silver particles are mixed into the binder component using a synthetic resin so that the mechanical bonding and the electrical connection can be simultaneously carried out.

Subsequently, when the cover 40 is formed of an opaque material such as metal, the through-hole 27 described with reference to FIG. 2 is not prepared. And a drive voltage is applied to the piezoelectric vibrating reed 32 while observing the frequency to irradiate laser lights on the leading ends of the weight attached electrode 21 of the vibrating arm 36 and/or the vibrating arm 35 of the piezoelectric vibrating reed 32 so that the frequency adjustment as fine adjustment in the mass reduction manner (ST18-1).

The cover 40 is then bonded with the package 57 by seam welding carrying out in vacuum (ST19-1), and necessary tests are carried out thereon to complete the formation of the piezoelectric device 30.

Alternatively, when the package 57 is encapsulated by the transparent cover 40, the cover 40 is bonded with the package 57 after the bonding of the piezoelectric vibrating reed 32 in ST17 (ST18-2).

In this case, for example, glass having a low melting point is heated to carry out the heating process of bonding the cover 40 with the package 57, however, a gas is generated from the glass or the conductive adhesive at this moment. Accordingly, such a gas is degassed from the through-hole described with reference to FIG. 2, and gold tin, more preferably, a metal ball formed of gold, germanium or the like, or pellet is put to the end 29 in vacuum and then melted by the radiation of laser lights. Accordingly, the through-hole 27 is hermetically encapsulated by the metal charging material 28 of FIG. 2 (ST19-2).

External laser lights are then irradiated on the leading end of the weight attached electrode 21 of the vibrating arm 36 and/or vibrating arm 35 of the piezoelectric vibrating reed 32 so as to have the lights transmit the transparent cover 40 formed of borosilicate glass or the like as shown in FIG. 2 (ST20-2). Necessary tests are then carried out to complete the formation of the piezoelectric device 30.

The invention is not limited to the above-described embodiments. Structures of the embodiments and modified embodiments may be properly combined or omitted to combine with other structures that are not shown.

In addition, the invention is not limited to the case of receiving the piezoelectric vibrating reed in a box-shaped package, but can be applied to all of the piezoelectric devices using the piezoelectric vibrating reed, the case receiving the piezoelectric vibrating reed in a cylindrical-shaped container, the case having the piezoelectric vibrating reed act as a gyro sensor regardless of the kinds of the piezoelectric vibrator and the piezoelectric oscillator. In addition, a pair of vibrating arms is disposed in the piezoelectric vibrating reed 32, however, the invention is not limited thereto but may have three vibrating arms or at least four.

The entire disclosure of Japanese Patent Application No 2005-129907, filed Apr. 27, 2005 is expressly incorporated by reference herein.

What is claimed is:

1. A piezoelectric vibrating reed, comprising:
    a base formed of a piezoelectric material and having a predetermined length and two main surfaces;
    a plurality of vibrating arms extended from a side of the base;
    a long groove formed along a long direction of each of the vibrating arms;
    a driver electrode disposed in the long groove;
    a support arm extended in a width direction from a connection portion spaced apart from the side of the base by a predetermined interval and extended outside the vibrating arms in the same direction as the vibrating arms; and
    a cut portion formed of the piezoelectric material reduced in its width direction at a location between the vibrating arms and the connection portion where the support arms are connected to the base as one body,
    wherein a through-hole is disposed at a location between the vibrating arms and the connection portion where the support arms are connected to the base as one body;
    wherein the through-hole includes an axis extending in a direction perpendicular to the longitudinal direction of the vibrating arms, parallel to one of the main surfaces of the vibrating reed, and completely through the entire through-hole, the cut portion includes an axis extending in a direction perpendicular to the longitudinal direction of the vibrating arms and being parallel to one of the main surfaces of the vibrating reed, and the axis of the through-hole is parallel to the axis of the cut portions and extends through the cut portions.

2. The piezoelectric vibrating reed according to claim 1, wherein the cut portion is disposed in the base with a distance spaced at least 1.2 times a width of the support arm from a joint of each of the vibrating arms.

3. The piezoelectric vibrating reed according to claim 1, further comprising a deformed portion protruding in a plus X direction and disposed at a side of each of the vibrating arms.

4. The piezoelectric vibrating reed according to claim 1, wherein a length of the support arm is set so that a leading end of the support arm is closer to the base than a leading end of the vibrating arm.

5. The piezoelectric vibrating reed according to claim 1, wherein a reduced width portion where a width of each of the vibrating arms is gradually reduced is present toward the leading end from the base, and a point P of the changed width is in the leading end where the width extends in the same value toward the leading end or starts to increase, and the point P of the changed width is disposed closer to the leading end of the vibrating arm than the leading end of the long groove, and wherein the long groove is at least partially formed in the reduced width portion.

6. The piezoelectric vibrating reed according to claim 5, wherein the width of each of the vibrating arms has a first reduced width portion having a width rapidly decreasing toward the leading end, and a second reduced width portion having a width gradually decreasing toward the leading end of the reduced width portion from an end of the first reduced width portion at a location of the joint of the vibrating arm with respect to the base.

7. The piezoelectric vibrating reed according to claim 5, wherein a value of maximum width/minimum width =M as a reduced width rate of the vibrating arm is determined by relationship of a rate of the length of the long groove with respect to the arm length of the vibrating arm =N.

8. The piezoelectric vibrating reed according to claim 7, wherein M is not less than 1.06 when N is about 61%.

9. The piezoelectric vibrating reed according to claim 1, wherein the axis of the through-hole is offset from the axis of the cut portion.

10. The piezoelectric vibrating reed according to claim 1, wherein the through-hole extends along the same axis as the axis of the cut portions.

11. The piezoelectric vibrating reed according to claim 1, wherein the through-hole includes a width and a length greater than the width, the axis of the through-hole extending along the length of the through-hole.

12. A piezoelectric device receiving a piezoelectric vibrating reed within a package or a case, the piezoelectric vibrating reed comprising:
a base formed of a piezoelectric material and having a predetermined length and two main surfaces;
a plurality of vibrating arms extended from a side of the base;
a long groove formed along a long direction of each of the vibrating arms;
a driver electrode disposed in the long groove;
a support arm extended in a width direction from a connection portion spaced apart from the side of the base by a predetermined interval and extended outside the vibrating arms in the same direction as the vibrating arms; and
a cut portion formed of the piezoelectric material reduced in its width direction at a location between the vibrating arms and the connection portion where the support arms are connected to the base as one body,
wherein a through-hole is disposed at a location between the vibrating arms and the connection portion where the support arms are connected to the base as one body,
wherein the through-hole includes an axis extending in a direction perpendicular to the longitudinal direction of the vibrating arms, parallel to one of the main surfaces of the vibrating reed, and completely through the entire through-hole, the cut portion includes an axis extending in a direction perpendicular to the longitudinal direction of the vibrating arms and being parallel to one of the main surfaces of the vibrating reed, and the axis of the through-hole is parallel to the axis of the cut portions and extends through the cut portions.

13. The piezoelectric device according to claim 12, wherein the axis of the through-hole extends along a longitudinal axis of the through-hole.

14. The piezoelectric device according to claim 13, wherein the through-hole includes a rectangular shape.

15. The piezoelectric device according to claim 12, wherein the axis of the through-hole is offset from the axis of the cut portion.

16. The piezoelectric device according to claim 12, wherein the through-hole extends along the same axis as the axis of the cut portions.

17. The piezoelectric vibrating reed according to claim 1, wherein the axis of the through-hole extends along a longitudinal axis of the through-hole.

18. The piezoelectric vibrating reed according to claim 17, wherein the through-hole includes a rectangular shape.

19. The piezoelectric device according to claim 12, wherein a reduced width portion where a width of each of the vibrating arms is gradually reduced is present toward the leading end from the base, and a point P of the changed width is in the leading end where the width extends in the same value toward the leading end or starts to increase, and the point P of the changed width is disposed closer to the leading end of the vibrating arm than the leading end of the long groove, and wherein the long groove is at least partially formed in the reduced width portion.

20. The piezoelectric device according to claim 12, wherein one of the plurality of vibrating arms is bonded to the support arm at a first location and at a second location along the one vibrating arm, wherein each of the first location and the second location are spaced apart and separated from a central axis extending through a width of the one vibrating arm and substantially perpendicular to a length of the one vibrating arm, the first location being disposed on an opposite side of the central axis from the second location.

21. A piezoelectric vibrating reed, comprising:
a base formed of a piezoelectric material having a predetermined length;
a plurality of vibrating arms extended from a side of the base;
a long groove formed along a long direction of each of the vibrating arms;
a driver electrode disposed in the long groove;
a support arm extended in a width direction from a connection portion spaced apart from the side of the base by a predetermined interval and extended outside the vibrating arms in the same direction as the vibrating arms; and
a cut portion formed of the piezoelectric material reduced in its width direction at a location between the vibrating arms and the connection portion where the support arms are connected to the base as one body;
wherein a through-hole is disposed at a location between the vibrating arms and the connection portion where the support arms are connected to the base as one body;
wherein the through-hole includes an axis extending in a direction perpendicular to the longitudinal direction of the vibrating arms and along the longitudinal axis of the through-hole;
wherein the cut portion includes an axis extending in a direction perpendicular to the longitudinal direction of the vibrating arms and along the longitudinal axis of the cut portion; and
wherein the axis of the through-hole is parallel to the axis of the cut portions, extends through the cut portions, and completely extends through the entire through-hole.

22. A piezoelectric device having a piezoelectric vibrating reed within a package or a case, the piezoelectric vibrating reed comprising:
a base formed of a piezoelectric material having a predetermined length;
a plurality of vibrating arms extended from a side of the base;
a long groove formed along a long direction of each of the vibrating arms;
a driver electrode disposed in the long groove;
a support arm extended in a width direction from a connection portion spaced apart from the side of the base by a predetermined interval and extended outside the vibrating arms in the same direction as the vibrating arms; and
a cut portion formed of the piezoelectric material reduced in its width direction at a location between the vibrating arms and the connection portion where the support arms are connected to the base as one body;
wherein a through-hole is disposed at a location between the vibrating arms and the connection portion where the support arms are connected to the base as one body;
wherein the through-hole includes an axis extending in a direction perpendicular to the longitudinal direction of the vibrating arms and along the longitudinal axis of the through-hole;
wherein the cut portion includes an axis extending in a direction perpendicular to the longitudinal direction of the vibrating arms and along the longitudinal axis of the cut portion; and
wherein the axis of the through-hole is parallel to the axis of the cut portions, extends through the cut portions, and completely extends through the entire through-hole.

* * * * *